United States Patent
Gaboriau et al.

(10) Patent No.: US 7,209,064 B1
(45) Date of Patent: Apr. 24, 2007

(54) SIGNAL PROCESSING SYSTEM WITH SPREADING OF A SPECTRUM OF HARMONIC FREQUENCIES OF A PULSE WIDTH MODULATOR OUTPUT SIGNAL

(75) Inventors: Johann Gaboriau, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/428,210

(22) Filed: Jun. 30, 2006

Related U.S. Application Data

(60) Provisional application No. 60/778,714, filed on Mar. 3, 2006.

(51) Int. Cl.
*H03M 1/82* (2006.01)
(52) U.S. Cl. .................................................... 341/152
(58) Field of Classification Search ................ 341/152, 341/143, 144
See application file for complete search history.

(56) References Cited

U.S. PATENT DOCUMENTS

| | | | |
|---|---|---|---|
| 5,548,286 A | 8/1996 | Craven | 341/126 |
| 5,784,017 A | 7/1998 | Craven | 341/126 |
| 5,815,102 A | 9/1998 | Melanson et al. | 341/143 |
| 6,150,969 A | 11/2000 | Melanson | 341/143 |
| 6,480,129 B1 | 11/2002 | Melanson | 341/143 |
| 6,965,335 B1 * | 11/2005 | Trotter et al. | 341/152 |

FOREIGN PATENT DOCUMENTS

WO    WO 97/37433    10/1997

OTHER PUBLICATIONS

J. Gaboriau et al., U.S. Appl. No. 10/767,906, filed Jan. 29, 2004, entitled "Circuits and Methods for Reducing Noise and Distortion in Pulse Width Modulation Systems,".

* cited by examiner

*Primary Examiner*—Rexford Barnie
*Assistant Examiner*—Joseph Lauture
(74) *Attorney, Agent, or Firm*—Hamilton & Terrile, LLP; Kent B. Chambers

(57) ABSTRACT

The signal processing system includes a pulse width modulator (PWM) that receives a quantizer output signal from a delta sigma modulator. Each quantizer output signal represents one of N quantization levels. For at least one of the quantization levels, the PWM can generate multiple, different PWM patterns. Thus, each quantization level in at least a subset of the N quantization levels is associated with at least two PWM patterns. In at least one embodiment, the subset of quantization levels represents the quantization of low level samples of a quantizer input signal. By associating multiple PWM patterns to at least the subset of the quantization levels, the pulse edges of the PWM patterns in a frame are shifted in time with respect to subsequent PWM patterns, which spreads the spectrum of harmonic frequencies of the PWM output signal. Spreading the spectrum of harmonic frequencies of the PWM output signal can reduce electromagnetic interference (EMI).

29 Claims, 12 Drawing Sheets

FIGURE 1 *(prior art)*

SIGNAL PROCESSING SYSTEM WITH SPREADING OF A SPECTRUM OF HARMONIC FREQUENCIES OF A PULSE WIDTH MODULATOR OUTPUT SIGNAL

CROSS-REFERENCE TO RELATED APPLICATION

This application claims the benefit under 35 U.S.C. § 119(e) and 37 C.F.R. § 1.78 of U.S. Provisional Application No. 60/778,714, filed Mar. 3, 2006 and entitled "Electromagnetic Interference (EMI) Reduction for Pulse Width Modulation (PWM) with Coordinated Channels", inventors Johann Gaboriau and John Melanson (referred to herein as the "Gaboriau Application I"). The Gaboriau Application I includes exemplary systems and methods and is incorporated by reference in its entirety.

BACKGROUND OF THE INVENTION

1. Field of the Invention

The present invention relates in general to the field of information processing, and more specifically to a system and method for spreading a spectrum of harmonic frequencies of a pulse width modulator output signal.

2. Description of the Related Art

Delta-sigma modulators (noise shapers) are particularly useful in digital to analog and analog to digital converters (DACs and ADCs). Using oversampling, a delta-sigma modulator spreads quantization noise power across the oversampling frequency band, which is typically much greater than the input signal bandwidth. Additionally, a delta sigma modulator performs noise shaping by acting as a lowpass filter to the input signal and a highpass filter to the noise; most of the quantization noise power is thereby shifted out of the signal band.

Delta sigma modulators can be combined with a pulse width modulator (PWM) to implement a signal processing system data converter that converts an oversampled input signal into a directly corresponding pulse width modulated output signal. The pulse width modulated output signal can be used to, for example, drive a digital amplifier.

U.S. Pat. No. 5,815,102 entitled "Delta Sigma PWM DAC to Reduce Switching" to John Melanson granted Sep. 29, 1998 (Melanson I), U.S. Pat. No. 6,150,969 entitled "Correction of Nonlinear Output Distortion in a Delta Sigma DAC" to John Melanson granted on Nov. 21, 2000 (Melanson II), and U.S. Pat. No. 6,480,129 entitled "Methods and Apparatus for Correction of Higher Order Delta Sigma Converters" to John Melanson granted on Nov. 12, 2002 (Melanson III), disclose exemplary ways for implementing the modulator and are hereby incorporated by reference.

Referring to FIG. 1, signal processing system 100 represents one utilization of a delta sigma modulator 102 followed by a PWM 104. The digital delta sigma modulator 102 receives a digital input signal x having an oversampled frequency of $f_{os}$. The data represented by input signal x is originally sampled at sampling frequency $f_S$. The delta sigma modulator 102 provides a noise shaped quantizer output signal q(n) to PWM 104. Each quantizer output signal q(n) is a digital data stream representing one of N different quantization levels. In at least one embodiment, the number of different quantization levels N equals the oversampling ratio (OSR)+1, where N is a positive integer. The OSR equals $f_{os}/f_S$. For example, the $n^{th}$ sample of quantizer output signal q(n) represents the $n^{th}$ sample of input signal x(n) with one of N different quantization levels, i.e. $q_i(n) \in \{0, 1, \ldots, N-1\}$. The quantizer output signal q(n) is the input signal to PWM 104.

The PWM 104 generates a respective PWM pattern for each quantization level of quantizer output signal q(n). The PWM output signal y(n) is a series of frames having a period T. The $n^{th}$ generated PWM pattern represents the $n^{th}$ frame of PWM output signal y(n), where n is an integer. The period T of each PWM output signal equals $1/f_s$. For each frame of a PWM output signal, the duty cycle of the PWM output signal equals the pulse width duration divided by the period T. Additionally, each frame of PWM output signal y(n) can be divided into $1/f_{os}$ (i.e. N-1) discrete time slots. Each time slot can be coded with a logical "1" or a logical "0", where the number of logical 1's in a frame define the pulse widths of PWM output signal y(n).

FIG. 2 depicts the PWM patterns 200 for N=65 quantization levels in Table 1. Table 1 represents one example of the PWM patterns for N=65 quantization levels. The PWM 104 selects a PWM pattern for each received quantizer output signal q(n). Thus, each PWM pattern has a one-to-one (1:1) association with a quantization level as depicted in Table 1. Quantization levels 29–35 represent exemplary low level signals. "Leading Zeros" represents the number of logical "zeros" beginning of a PWM pattern. "Ones" represent the duration of logical "ones" in the PWM pattern and represent the "pulse" in the PWM pattern. The total number of logical ones times the duration of each time slot in a frame of PWM output signal y(n) equals the duration of the pulse width. "Trailing Zeros" represents the number of logical "zeros" after the pulse in the PWM pattern. The PWM output signals of Table 1 represent "centered, grow from the right" patterns with the odd quantization levels (3, 5, ...) having centered pulses and the even quantization levels (2, 4, ...) having centered right pulses. Other patterns, such as grow from the left or non-centered pulses, can also be used to represent quantization levels.

TABLE 1

| Quantization Level | PWM Patterns | | |
| --- | --- | --- | --- |
| | Leading Zeros | Ones | Trailing Zeros |
| 0 | 32 | 0 | 32 |
| 1 | 32 | 1 | 31 |
| 2 | 31 | 2 | 31 |
| 3 | 31 | 3 | 30 |
| ... | ... | ... | ... |
| 29 | 18 | 29 | 17 |
| 30 | 17 | 30 | 17 |
| 31 | 17 | 31 | 16 |
| 32 | 16 | 32 | 16 |
| 33 | 16 | 33 | 15 |
| 34 | 16 | 34 | 15 |
| 35 | 15 | 35 | 14 |
| ... | ... | ... | ... |
| 62 | 1 | 62 | 1 |
| 63 | 1 | 63 | 0 |
| 64 | 0 | 64 | 0 |

The PWM output signal y(n) drives amplifier 106. The amplifier 106 in turn drives a load 108 represented by impedance Z. Load 108 is, for example, one or more audio speakers or a servo motor. In at least one embodiment, the amplifier 106 includes switches 112 and 114 that change conductivity in conjunction with the pulses of PWM output signal y(n). In some applications, such as a power amplifier application, amplifier 106 represents a power amplifier and has a relatively high maximum voltage, such as +30 V, and high maximum current, such as 5 A. Various factors, such as the parasitic capacitances 116 and 118 and parasitic inductance 120, cause the linear amplifier to radiate energy at the switching frequency of switches 112 and 114 and other harmonic frequencies of the switching frequency. It is difficult to shield this radiated energy to prevent leakage into the rest of the system 100. Additionally, the resulting electromagnetic interference (EMI) from the radiated energy can easily exceed EMI standards.

Potential EMI problems with system 100 are particularly acute for audio input signals x(n) that cause pure or approximate square wave PWM patterns in frames of PWM output signal y(n). Generally, low level signals (such as pauses or silence) are the most common cause of pure or approximate square wave PWM patterns in frames of PWM output signal y(n). Delta sigma modulator 102 quantizes each low level input signal sample as alternating or approximately alternating high and low levels. As depicted in Table 1 and FIG. 2, quantization levels 29–35 each cause the PWM 104 to generate a frame of pure or approximate square waves. Square waves and approximate square waves present particularly problematic EMI problems because the switching frequency of switches 112 and 114 approximately equals the sampling frequency $f_S$. The sampling frequency $f_S$ often resides in the radio frequency spectrum and is, for example, 384 kHz. Thus, system 100 radiate energy at 384 kHz and at harmonic frequencies of 384 kHz. The radiated energy in the spectrum of harmonic frequencies of PWM output signal y(n) can be significant and exceed EMI standards.

FIG. 3 depicts a frequency analysis 300 of the harmonic frequencies of 384 MHz square waves and approximate square waves between 0 and 8 MHz and energy levels between 0 and −35 dB. The square waves have significant energy at the fundamental harmonic frequency of 384 kHz and significant energy at higher harmonic frequencies. As depicted in FIG. 3, significant energy resides in the radio frequency (RF) spectrum. FIG. 4 depicts a frequency analysis 400 of frequencies between 0 and 25 MHz and energy levels between 0 and −200 dB with significant energy at the harmonic frequencies of 384 MHz.

SUMMARY OF THE INVENTION

In at least one embodiment of the present invention, a method of spreading a spectrum of harmonic frequencies in a PWM output signal includes receiving an input signal representing one of N quantization levels of a delta sigma modulator, wherein N is an integer greater than or equal to two (2). The method further includes selecting a first pulse width modulator (PWM) pattern associated with the quantization level from a group of K PWM patterns. "K" is an integer greater than or equal to two (2) and the PWM patterns have discrete time slots during which a pulse can rise and fall. The method further includes selecting a second PWM pattern associated with the quantization level from the group of K patterns. Selection of the second PWM pattern causes a rising edge of the second PWM pattern to shift in time at least two discrete time slots relative to a rising edge of the first PWM pattern to spread the spectrum of harmonic frequencies in the PWM output signal. The method also comprises generating a frame of the PWM output signal with the selected PWM pattern.

In another embodiment of the present invention, a signal processing system to spread a spectrum of harmonic frequencies in a PWM output signal includes a delta sigma modulator to generate a delta sigma modulator output signal sample representing one of N quantization levels, wherein N is an integer greater than or equal to two (2). The signal processing system further includes a pulse width modulator (PWM), coupled to the delta sigma modulator, to (A) select a pulse width modulator (PWM) pattern associated with the quantization level from a group of K PWM patterns, wherein (i) for at least one of the quantization levels K is an integer greater than or equal to two (2), (ii) the PWM patterns have discrete time slots during which a pulse can rise and fall, and (iii) for each group having at least two (2) PWM patterns, rising edges of the PWM patterns differ from each other by at least two of the discrete time slots to spread the spectrum of harmonic frequencies in the PWM output signal and (B) generate a frame of the PWM output signal with the selected PWM pattern.

In a further embodiment of the present invention, an apparatus for spreading a spectrum of harmonic frequencies in a PWM output signal includes means for receiving an input signal representing one of N quantization levels of a delta sigma modulator, wherein N is an integer greater than or equal to two (2). The apparatus further includes means for selecting a pulse width modulator (PWM) pattern associated with the quantization level from a group of K PWM patterns. For at least one of the quantization levels, K is an integer greater than or equal to two (2). The PWM patterns have discrete time slots during which a pulse can rise and fall. Additionally, for each group having at least two (2) PWM patterns, rising edges of the PWM patterns differ from each other by at least two of the discrete time slots to spread the spectrum of harmonic frequencies in the PWM output signal. The apparatus further includes means for generating a frame of the PWM output signal with the selected PWM pattern.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The signal processing system includes a pulse width modulator (PWM) that receives a quantizer output signal from a delta sigma modulator. Each quantizer output signal represents one of N quantization levels. For at least one of the quantization levels, the PWM can generate multiple, different PWM patterns. Thus, each quantization level in at least a subset of the N quantization levels is associated with at least two PWM patterns. In at least one embodiment, the subset of quantization levels represents the quantization of low level samples of a quantizer input signal. By associating multiple PWM patterns to at least the subset of the quantization levels, the pulse edges of the PWM patterns in a frame are shifted in time with respect to subsequent PWM patterns, which spreads the spectrum of harmonic frequencies of the PWM output signal. Spreading the spectrum of harmonic frequencies of the PWM output signal can reduce electromagnetic interference (EMI).

Figure 1:
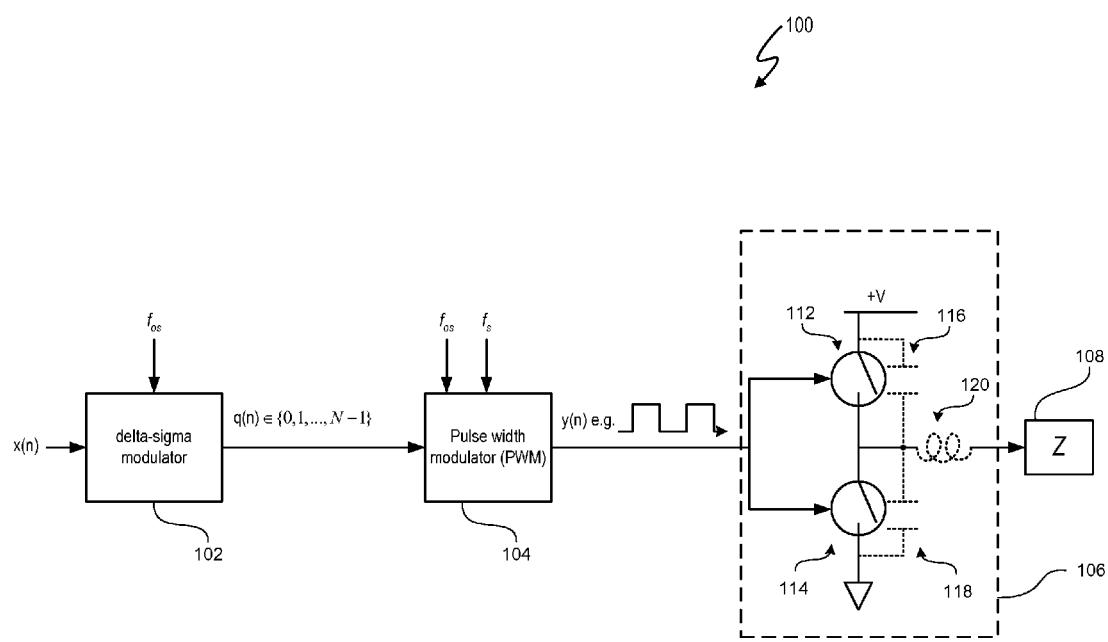
FIG. 1 (labeled prior art) depicts a signal processing system having a delta sigma modulator/pulse width modulator (PWM) combination.
Figure 2:
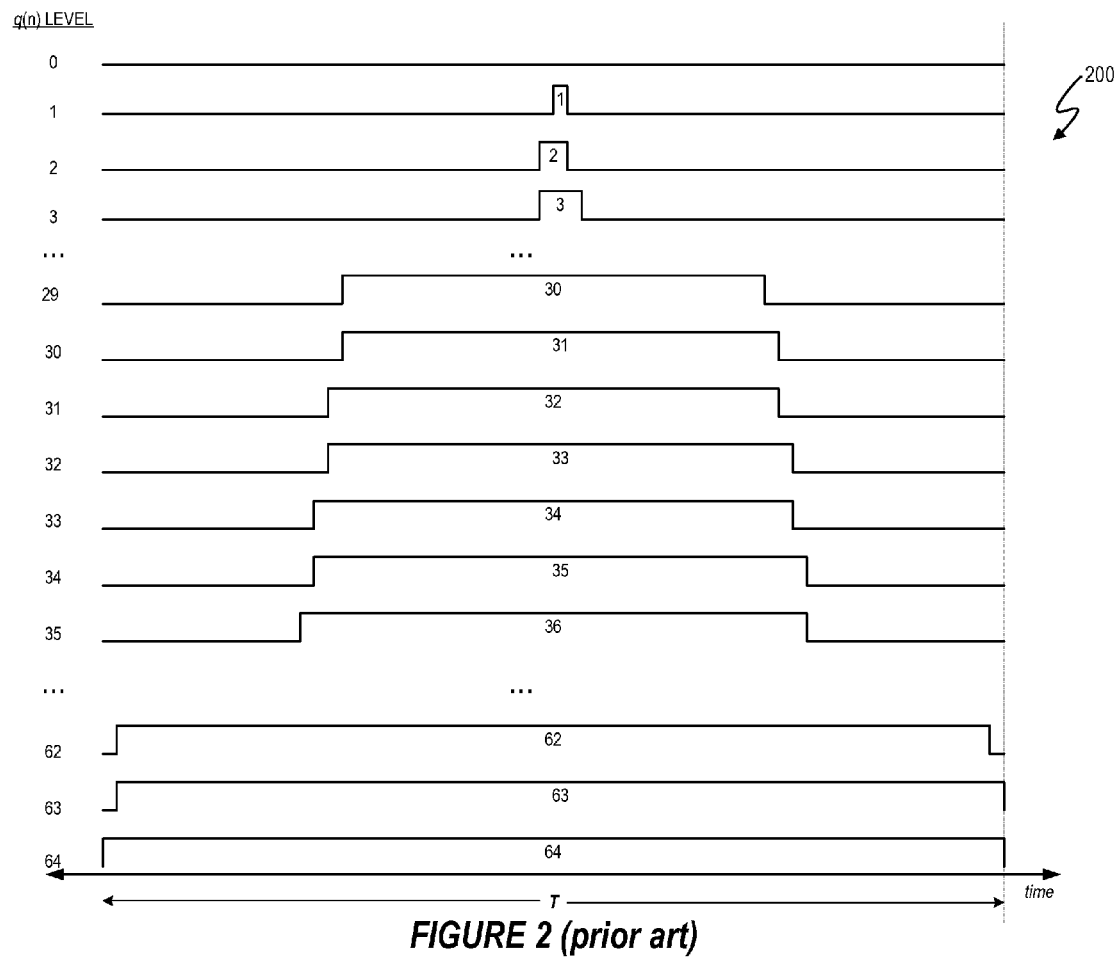
FIG. 2 (labeled prior art) depicts PWM patterns for 0–64 quantization levels.
Figure 3:
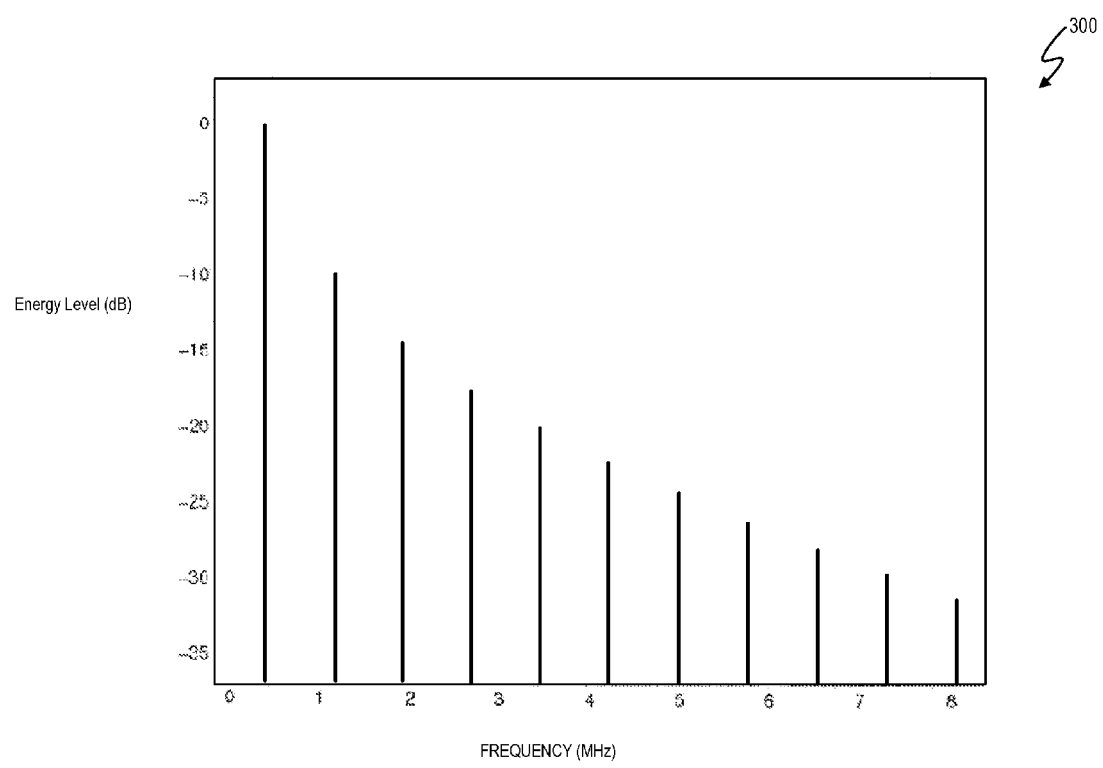
FIG. 3 (labeled prior art) depicts a frequency analysis of harmonic frequencies of 384 MHz repetitive square waves between 0 and 8 MHz.
Figure 4:
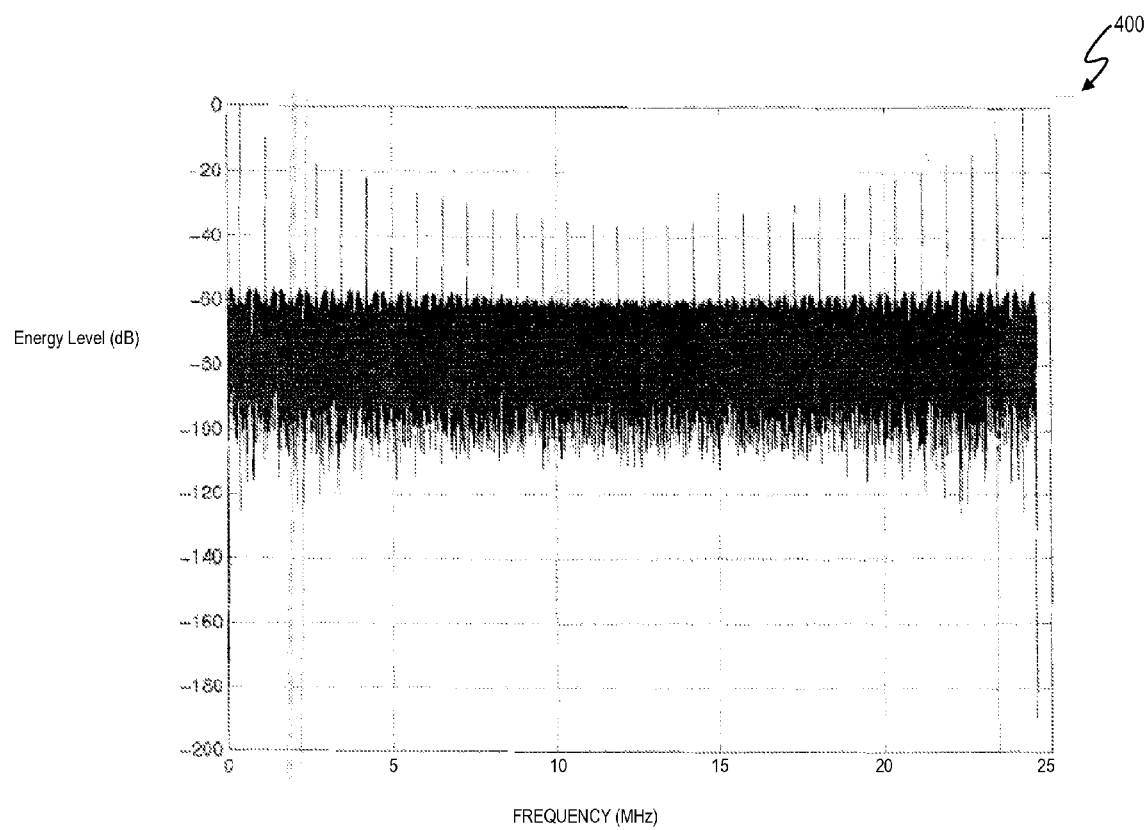
FIG. 4 (labeled prior art) depicts a frequency analysis of harmonic frequencies of 384 MHz repetitive square waves between 0 and 25 MHz.
Figure 5:
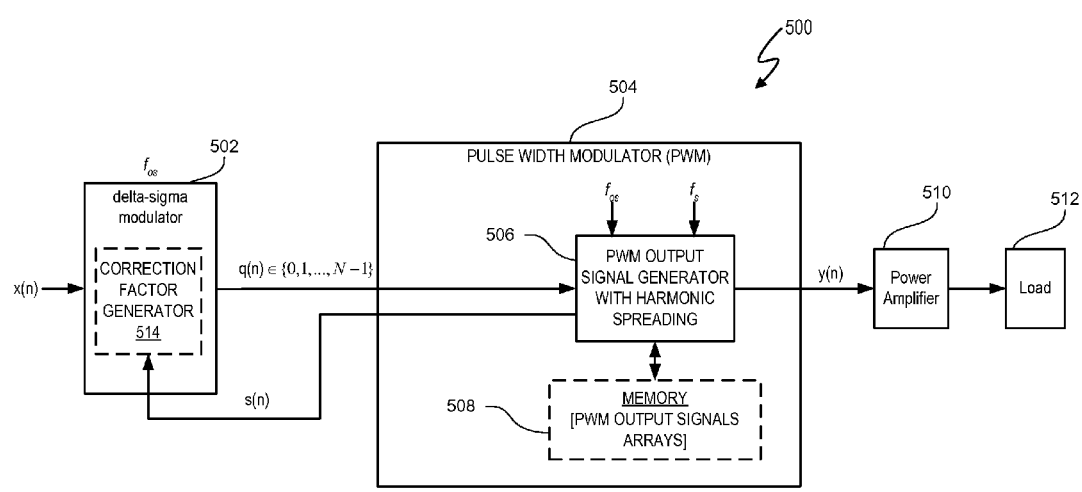
FIG. 5 depicts a signal processing system that spreads a spectrum of harmonic frequencies of a PWM output signal.

FIG. 5 depicts a signal processing system 500 that spreads a spectrum of harmonic frequencies of the PWM output signal y(n). The signal processing system 500 includes a delta sigma modulator 502 that quantizes each sample of quantizer input signal x(n) to one of N quantization levels. The signal processing system 500 also includes a pulse width modulator 504 (PWM 504) that receives multiple quantizer output signal q(n), selects a PWM output signal y(n), and generates PWM output signal y(n). Each quantizer output signal q(n) is a digital data stream representing one of N different quantization levels. In one embodiment, N=65. The PWM output signal generator 506 of PWM 504 receives each quantizer output signal q(n) and generates a respective PWM pattern for each frame of the PWM output signal y(n). In at least one embodiment, the quantizer output signal q(n) is directly applied to the PWM 504 as the PWM input signal. In other embodiments, the quantization level can be determined by PWM 504 from sources other than or in addition to quantizer output signal q(n). For example, the quantization level can be determined from the loop filter state variables or loop filter output data.

For at least a subset of the quantization levels, there is a one-to-K association between a quantization level and a PWM pattern. "K" represents an integer greater than or equal to two (2). "K" can be different for each quantization level. In at least one embodiment, the subset of quantization levels having a 1:K association with PWM patterns represents low-level samples of the delta sigma modulator input signal x(n).

Since each PWM pattern has different harmonic spectra and phases, the different PWM patterns associated with a quantization level spreads the spectrum of harmonic frequencies of the PWM output signal y(n). As described in more detail below, in at least one embodiment, spreading the spectrum of harmonic frequencies of repeating PWM patterns reduces energy radiation of the signal processing system 500.

The PWM output signal generator 506 generates the PWM patterns based on the quantization level of quantizer output signal q(n). Generation of PWM patterns to encode a particular quantization level is a matter of design choice and can be accomplished in many different ways. For example, for a quantization level having a 1:1 association with a PWM pattern, the PWM output signal generator 506 can use a quantization level as a code for hardwired logic to generate the PWM pattern associated with the quantization level. For a quantization level having a 1:K association with PWM patterns, the PWM output signal generator 506 selects a PWM pattern from the K PWM pattern associated with the quantization level, and then the PWM output signal generator 506 generates the selected PWM pattern. In at least one embodiment, the PWM output signal generator 506 randomly selects the PWM pattern from among the K PWM patterns associated with the quantization level. Random selection significantly reduces the likelihood that the same PWM pattern is repetitively selected and, thus, spreads the spectrum of harmonic frequencies of PWM output signal y(n). In at least one embodiment, more sophisticated selection processes, such as taking into consideration one or more prior PWM pattern selections, can be implemented to further spread and/or ensure spreading the spectrum of harmonic frequencies of PWM output signal y(n).

In another embodiment, generation of the PWM patterns can be made by selecting PWM patterns from multiple arrays of PWM patterns stored in a memory. In this embodiment, the PWM patterns are predetermined and stored in a memory 508, such as a read-only memory (ROM). In at least one embodiment, multiple arrays of the PWM patterns are stored in respective look-up tables within the memory 508. Thus, the PWM output signal generator 506 can select a PWM pattern by selecting the particular look-up table and a particular PWM pattern in the look-up table. In at least one other embodiment, a single look-up table can be used to store the PWM patterns and logic can be used to select different PWM patterns. Selection of the particular PWM pattern is discussed in more detail below.

In at least one embodiment, memory 508 stores arrays of 65 PWM patterns in four (4) look-up tables. Table 2, Table 3, Table 4, and Table 5 represent the four tables of PWM patterns. "Leading Zeros" represents the number of logical "zeros" beginning of a PWM pattern. "Ones" represent the duration of logical "ones" in the PWM pattern and represent the "pulse" in the PWM pattern. The total number of logical ones times the duration of each time slot in a frame of PWM output signal y(n) equals the duration of the pulse width. "Trailing Zeros" represents the number of logical "zeros" after the pulse in the PWM pattern.

TABLE 2

| | PWM Patterns | | |
|---|---|---|---|
| Quantization Level | Leading Zeros | Ones | Trailing Zeros |
| 0 | 32 | 0 | 32 |
| 1 | 32 | 1 | 31 |
| 2 | 31 | 2 | 31 |
| 3 | 31 | 3 | 30 |
| ... | ... | ... | ... |
| 29 | 18 | 29 | 17 |
| 30 | 17 | 30 | 17 |
| 31 | 17 | 31 | 16 |
| 32 | 16 | 32 | 16 |
| 33 | 16 | 33 | 15 |
| 34 | 16 | 34 | 15 |
| 35 | 15 | 35 | 14 |
| ... | ... | ... | ... |
| 62 | 1 | 62 | 1 |
| 63 | 1 | 63 | 0 |
| 64 | 0 | 64 | 0 |

TABLE 3

| Quantization Level | PWM Patterns | | |
|---|---|---|---|
| | Leading Zeros | Ones | Trailing Zeros |
| 0 | 32 | 0 | 32 |
| 1 | 31 | 1 | 32 |
| 2 | 31 | 2 | 31 |
| 3 | 30 | 3 | 31 |
| ... | ... | ... | ... |
| 29 | 17 | 29 | 18 |
| 30 | 17 | 30 | 17 |
| 31 | 16 | 31 | 17 |
| 32 | 16 | 32 | 16 |
| 33 | 15 | 33 | 16 |
| 34 | 15 | 34 | 15 |
| 35 | 14 | 35 | 15 |
| ... | ... | ... | ... |
| 62 | 1 | 62 | 1 |
| 63 | 1 | 63 | 0 |
| 64 | 0 | 64 | 0 |

TABLE 4

| Quantization Level | PWM Patterns | | |
|---|---|---|---|
| | Leading Zeros | Ones | Trailing Zeros |
| 0 | 32 | 0 | 32 |
| 1 | 32 | 1 | 31 |
| 2 | 31 | 2 | 31 |
| 3 | 31 | 3 | 30 |
| ... | ... | ... | ... |
| 29 | 10 | 29 | 25 |
| 30 | 9 | 30 | 25 |
| 31 | 8 | 31 | 25 |
| 32 | 7 | 32 | 25 |
| 33 | 6 | 33 | 25 |
| 34 | 5 | 34 | 25 |
| 35 | 4 | 35 | 25 |
| ... | ... | ... | ... |
| 62 | 1 | 62 | 1 |
| 63 | 1 | 63 | 0 |
| 64 | 0 | 64 | 0 |

TABLE 5

| Quantization Level | PWM Patterns | | |
|---|---|---|---|
| | Leading Zeros | Ones | Trailing Zeros |
| 0 | 32 | 0 | 32 |
| 1 | 32 | 1 | 31 |
| 2 | 31 | 2 | 31 |
| 3 | 31 | 3 | 30 |
| ... | ... | ... | ... |
| 29 | 25 | 29 | 10 |
| 30 | 25 | 30 | 9 |
| 31 | 25 | 31 | 8 |
| 32 | 25 | 32 | 7 |
| 33 | 25 | 33 | 6 |
| 34 | 25 | 34 | 5 |
| 35 | 25 | 35 | 4 |
| ... | ... | ... | ... |
| 62 | 1 | 62 | 1 |
| 63 | 1 | 63 | 0 |
| 64 | 0 | 64 | 0 |

Table 2 is identical to Table 1 with centered, grow from the right patterns. Table 3 represents centered, grow from left patterns. Table 4 is identical to Table 2 except for the PWM patterns corresponding to quantization levels 29–35, which represent respective low-level input signals x(n). The PWM patterns associated with quantization levels 29–35 in Table 4 grow to the left and are shifted to the left in time relative to the corresponding PWM patterns in Table 2. Table 5 is identical to Table 3 except for the PWM patterns associated with quantization levels 29–35, which also represent respective low-level input signals x(n). The PWM patterns associated with quantization levels 29–35 in Table 5 grow to the right and are shifted to the right in time relative to the corresponding PWM patterns in Table 3. The PWM patterns associated with quantization levels 29, 30, 32, and 34 are all different between Table 2, Table 3, Table 4, and Table 5. The PWM patterns associated with quantization levels 30, 32, and 34 are the same between Table 2 and Table 3. However, for PWM patterns quantization levels 30, 32, and 34, Table 4 and Table 5 are different than both Table 2 and Table 3. Thus, PWM output signal generator 506 can choose from four (K=4) different PWM patterns for each of quantization levels 29, 30, 32, and 34. PWM output signal generator 506 can choose three (K=3) different PWM patterns for each of quantization levels 30, 32, and 34.

The PWM output signal generator 506 generates a PWM pattern for each frame of the PWM output signal y(n). The particular PWM pattern generated depends upon the quantization level indicated by quantizer output signal q(n). In at least one audio context, a 1:2 association exists between PWM patterns and quantization levels 0–28 and 36–64 and a 1:K association exists between PWM patterns and quantization levels 29–35. In the audio context, quantization levels 29–35 represent low amplitude levels of samples of input signal x(n). The quantization levels 0–28 and 36–64 represent higher amplitude samples of input signal x(n), and the harmonic frequencies of quantization levels 0–28 and 36–64 typically have a natural spreading of the spectrum of harmonic frequencies.

For levels 0–28 and 36–64, PWM output signal generator 506 selects PWM patterns from Table 2 and Table 3. In one embodiment, PWM output signal generator 506 selects the particular table for quantization levels 0–28 and 36–64 to reduce noise. In at least one embodiment, PWM output signal generator 506 receives quantizer input data in addition to the quantizer output signal q(n). Thus, although corresponding quantization levels of Table 2 and Table 3 have the same pulse widths, a pulse that starts earlier provides more energy than a corresponding pulse that starts later. Accordingly, if the quantizer input data indicates that the quantizer (not shown) of delta sigma modulator 502 effectively rounded down to choose the quantizer output signal q(n), PWM output signal generator 506 selects the PWM pattern from Table 3 since Table 3 represents centered, grow from left patterns. If the quantizer input data indicates that a quantizer (not shown) of delta sigma modulator 502 effectively rounded up to choose the quantizer output signal q(n), PWM output signal generator 506 selects the PWM pattern from Table 2 since Table 2 represents centered, grow from right patterns.

As previously stated, for quantization levels 29, 30, 32, and 34, PWM output signal generator 506 selects PWM patterns from Table 2, Table 3, Table 4, and Table 5. For quantization levels 30, 32, and 34, PWM output signal generator 506 selects PWM patterns from Table 2 (or Table 3), Table 4, and Table 5. The subset of quantization levels, quantization levels 29–35, represent low level signals such as a silence (or near silence). Low level signals that endure for more than one period for PWM 504 are conventionally coded as repeating square waves with a frequency of $f_s$.

Square waves generally have a 50% duty cycle. As described previously, the energy in the harmonics of square waves can cause significant EMI. When a PWM input signal indicating any of quantization levels 29–35 is received by PWM 504, the PWM output signal generator 506 selects from multiple, different PWM patterns for each of quantization levels 29–35, thus, spreading the spectrum of harmonic frequencies of PWM output signal y(n).

The PWM output signal y(n) can be provided to a power amplifier 510, which in turn drives load 512. Load 512 can be any load, such as one or more audio speakers. In at least one embodiment, spreading the spectrum of harmonic frequencies of PWM output signal y(n) reduces EMI from the power amplifier 510.

Figure 7:
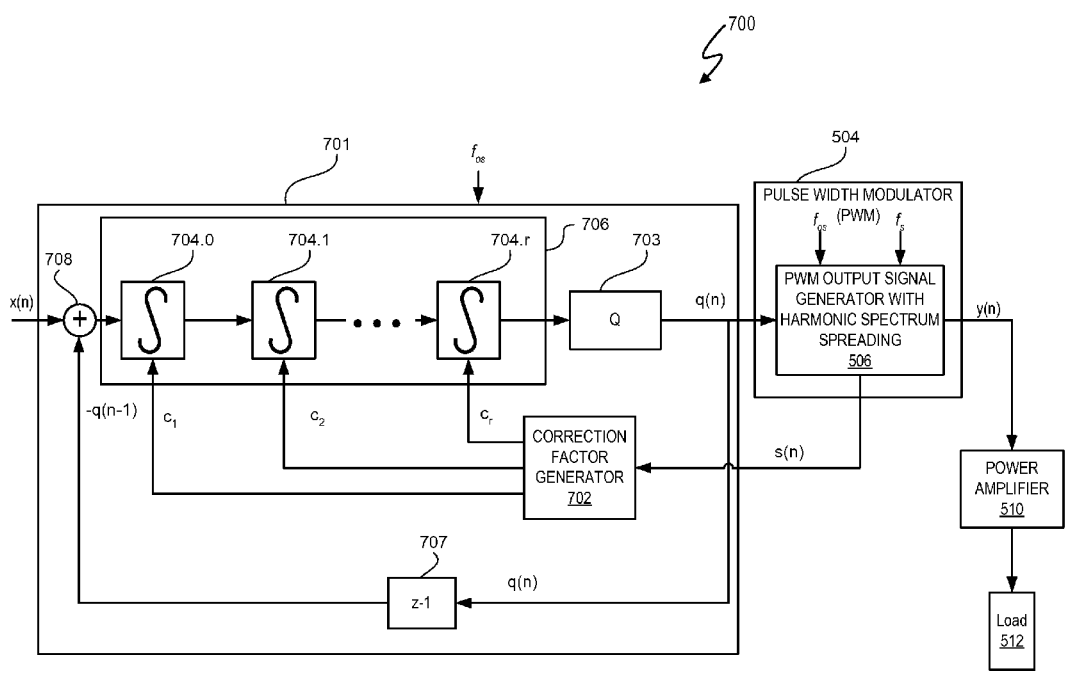
FIG. 7 depicts a delta sigma modulator having a correction factor generator.

As described in more detail in conjunction with FIG. 7, PWM patterns cause non-linear distortion in the PWM output signal y(n). In at least one embodiment, signal processing system 500 includes a correction factor generator 514 to generate correction factors for the quantizer input signals. The correction factor generator 514 responds to a PWM pattern selection signal s(n) that identifies the PWM pattern selected by PWM output signal generator 506.

Figure 6:
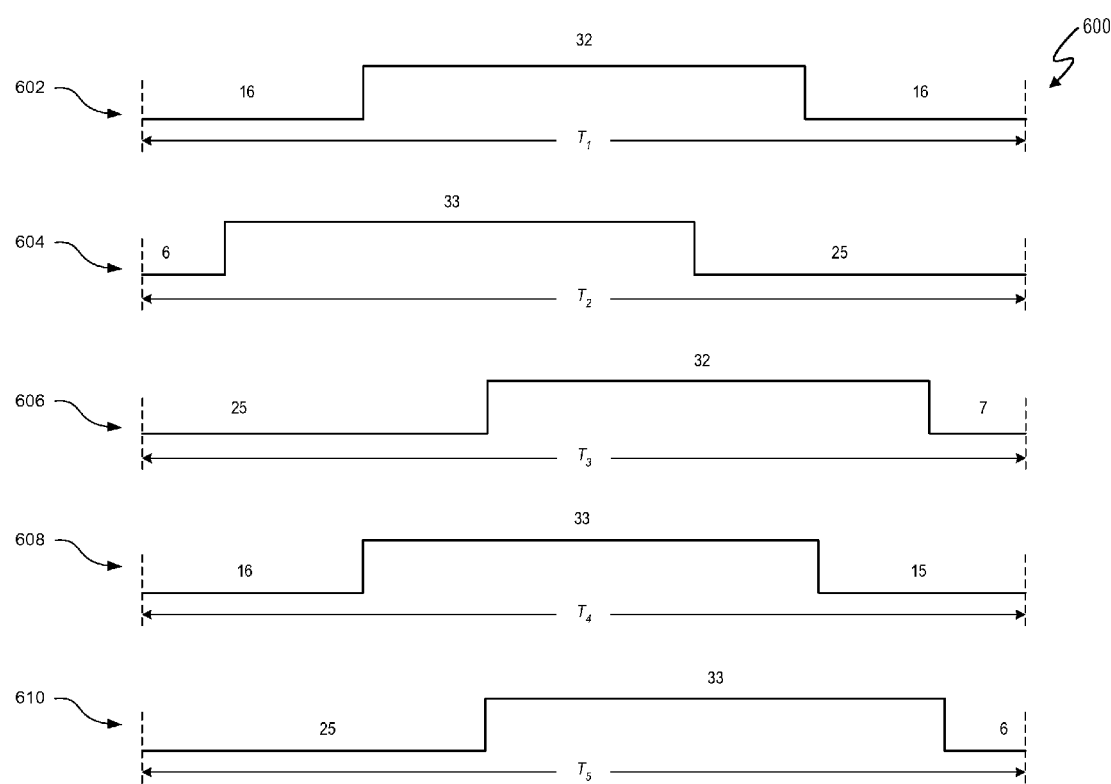
FIG. 6 depicts PWM patterns of a PWM output signal for various quantization levels.

FIG. 6 depicts a series of PWM patterns 600 of PWM output signal y(n) selected for quantization levels 32, 33, 32, 33, and 33. Each PWM pattern 602, 604, 606, 608, and 610 represents one frame of PWM output signal y(n) and occurs during respective periods $T_1$, $T_2$, $T_3$, $T_4$, and $T_5$. Each of periods $T_1$, $T_2$, $T_3$, $T_4$, and $T_5$ have the same duration. The PWM patterns 600 occur in successive frames of PWM output signal y(n) but are arranged horizontally in FIG. 6 to illustrate the shifting of pulse centers and, thus, pulse edges. In at least one embodiment, the PWM patterns 602, 604, 606, 608, and 610 are respectively generated by PWM output signal generator 506 from Table 2, Table 4, Table 5, Table 2, and Table 5. Each pattern has 64 time slots, 0–63, for either a logical one or a logical zero. In at least one embodiment, the number of time slots equals $f_{os}/f_S$. For example, time slots 0–16 and 48–63 of PWM pattern 602 contain logical zeros, and time slots 16–47 contain logical ones. Thus, the rising edge of PWM pattern 602 occurs in time slot 16, and the falling edge of PWM pattern 602 occurs 31 time slots later in time slot 47. In at least one embodiment, the rising and falling edges of PWM patterns associated with the same quantization level differ by at least two (2) time slots. For example, the rising and falling edges of PWM patterns 602 and 606, associated with the quantization level 32, differ from each other by 9 time slots. The rising and falling edges of patterns 604, 608, and 610, associated with quantization level 33, differ from each other by 9 time slots.

FIG. 7 depicts a signal processing system 700 having a delta sigma modulator 701, which is one embodiment of delta sigma modulator 502. Delta sigma modulator 701 includes a correction factor generator 702 to generate correction factors $c_0, c_1, \ldots, c_r$ for respective integrators 704.0, 704.1, ..., 704.r of exemplary loop filter 706. Correction factor generator 702 represents one embodiment of correction factor generator 514. The correction factors $c_0, c_1, \ldots, c_r$ provide correction for non-linearities in the selected PWM output signal y(n) caused by, for example, the PWM patterns. In another embodiment, correction factors are generated for at least one but not all of the integrators 704.0, 704.1, ..., 704.r.

In at least one embodiment, correction factors $c_0, c_1, c_r$ match up one-to-one with the selected PWM pattern indicated by PWM pattern selection signal s(n). In at least one embodiment, correction factors $c_0, c_1, \ldots, c_r$ are stored in a memory, such as a read-only memory (ROM) and indexed by quantization level, integrator identifier, and PWM pattern. PWM pattern selection signal s(n) is provided to the correction factor generator 702 by PWM output signal generator 506. The PWM pattern selection signal s(n) identifies the PWM pattern in the $n^{th}$ frame of PWM output signal y(n) and implicitly identifies the quantization level of quantizer output signal q(n) since, in at least one embodiment, the pulse width of the quantization level matches the quantization level. The quantizer output signal q(n) of quantizer 703 is fed back via delay 708 to summing node 708 to add −q(n−1) to the input signal sample x(n).

From the quantization level indicated by the quantizer output signal q(n), the PWM pattern identified by the PWM pattern selection signal s(n), and the respective identifiers for integrators 704.0, 704.1, ..., 704.r, the correction factor generator 702 can select and provide the appropriate correction factor to each of the r+1 integrators 704.0, 704.1, ..., 704.r. The individual correction factors $c_0, c_1, \ldots, c_r$ can be determined, for example, as described in Melanson II, Melanson III, and the Gaboriau Application I. The Gaboriau Application I includes MatLab® code in the "fbwithcorr_EMI.m" file that describes an exemplary delta sigma modulator and determination of the correction factors $c_0, c_1, \ldots, c_r$ for the exemplary delta sigma modulator.

Figure 8:
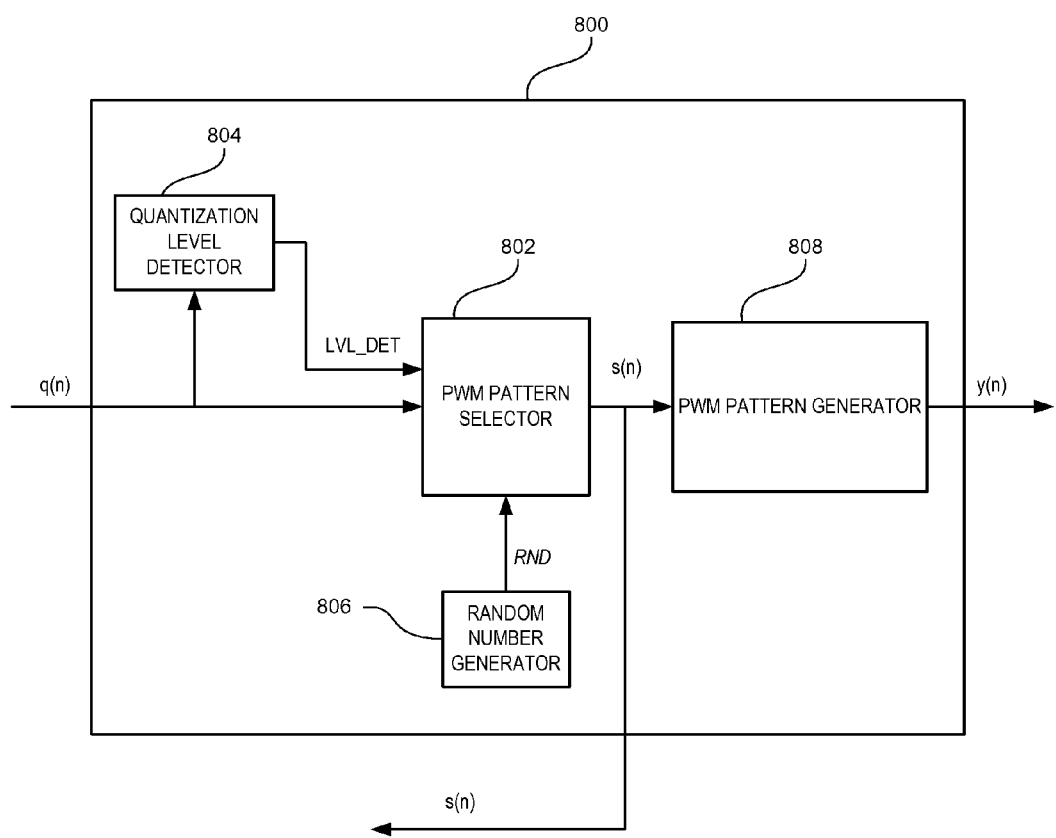
FIG. 8 depicts a PWM output signal generator having a pulse width modulator pattern selector.

FIG. 8 depicts a PWM output signal generator 800 having a PWM pattern selector 802 to select PWM patterns to spread the spectrum of harmonic frequencies in PWM output signal y(n). The PWM output signal generator 800 represents one embodiment of PWM output signal generator 506. The PWM pattern selector selects PWM patterns to be generated by PWM pattern generator 808 based upon the quantization levels indicated by quantizer output signal q(n). In at least one embodiment, for each quantization level indicated by quantizer output signal q(n), the quantization level detector 804 receives each sample of the quantizer output signal q(n) and determines if the quantization level represents a level of input signal x(n) that is greater than a predetermined threshold. The quantization level detector 804 generates data signal LVL_DET to indicate whether the quantization level exceeds the threshold or not. In at least one embodiment, the input signal x(n) (FIG. 7) is an audio signal, and the threshold is set to discriminate between quantization levels representing low amplitude samples of input signal x(n) levels and quantization levels representing higher amplitude samples of input signal x(n) levels. In at least one embodiment, low amplitude level signals indicate silence or near silence and, in a one-bit delta sigma modulator, are represented by alternating or near alternating logical ones and zeros. In at least one embodiment, quantization levels 29–35 represent low amplitude input signal samples, and quantization levels 0–28 and 36–64 represent higher level amplitude signal samples.

Quantization level detector 804 provides the quantization level data signal LVL_DET to PWM pattern selector 802. In at least one embodiment, when the data signal LVL_DET indicates a quantization level representing higher amplitude sample input signal level, PWM pattern selector 802 selects the PWM pattern associated with the quantization level indicated by quantizer output signal q(n). In at least one embodiment, the PWM pattern selector selects the PWM pattern from Table 2 or Table 3 as previously described. When the data signal LVL_DET indicates a quantization level representing a low-amplitude sample input signal level, PWM pattern selector 802 selects one of K PWM patterns associated with the quantization level. In at least one embodiment, the rising edges of the K PWM patterns differ from each other by at least two discrete time slots to spread the spectrum of harmonic frequencies in the PWM output signal.

In at least one embodiment, PWM pattern selector 802 selects the PWM pattern using a random number RND generated by random number generator 806. Making random selections of PWM patterns spreads the spectrum of harmonic frequencies of PWM output signal y(n). The PWM pattern selector 802 generates PWM pattern selection signal s(n), which indicates the PWM pattern to be generated for the quantization level represented by quantizer output signal q(n). The PWM pattern generator receives the PWM pattern selection signal s(n) and generates a PWM pattern in a frame of PWM output signal y(n). PWM pattern selector 802 also provides the PWM pattern selection signal s(n) to correction factor generator 702 for selecting the correction factors $c_1$, $c_2$, ..., $c_r$ as previously described.

Figure 9:
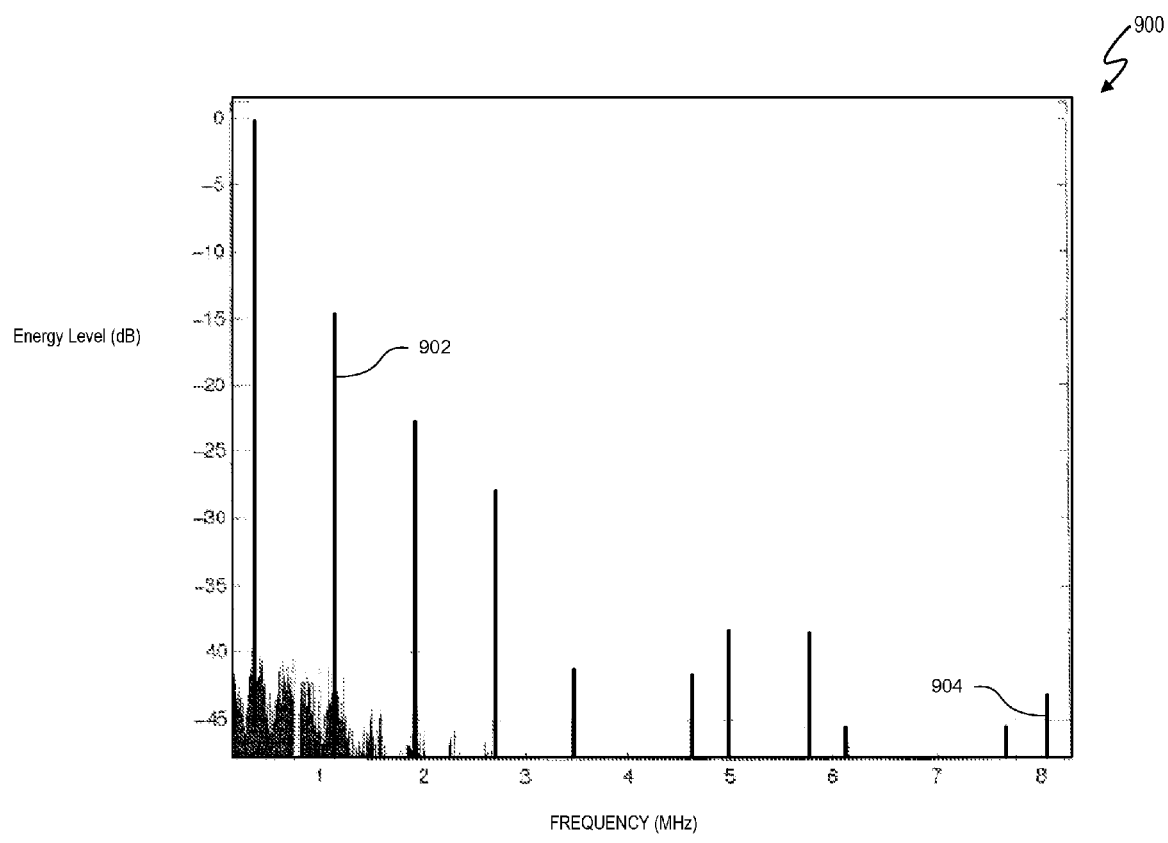
FIG. 9 depicts a frequency analysis of harmonic frequencies of 384 MHz repetitive square waves between 0 and 8 MHz.

FIG. 9 depicts a frequency analysis 900 of the harmonic frequencies of 384 MHz repetitive square waves between 0 and 8 MHz and energy levels between 0 and −35 dB. For $f_S$ equal 384 kHz (fundamental frequency), the repetitive square waves have significantly less energy at the second harmonic frequency 902 at 768 kHz through the twenty-first harmonic frequency 904 at 8.064 MHz.

Figure 10:
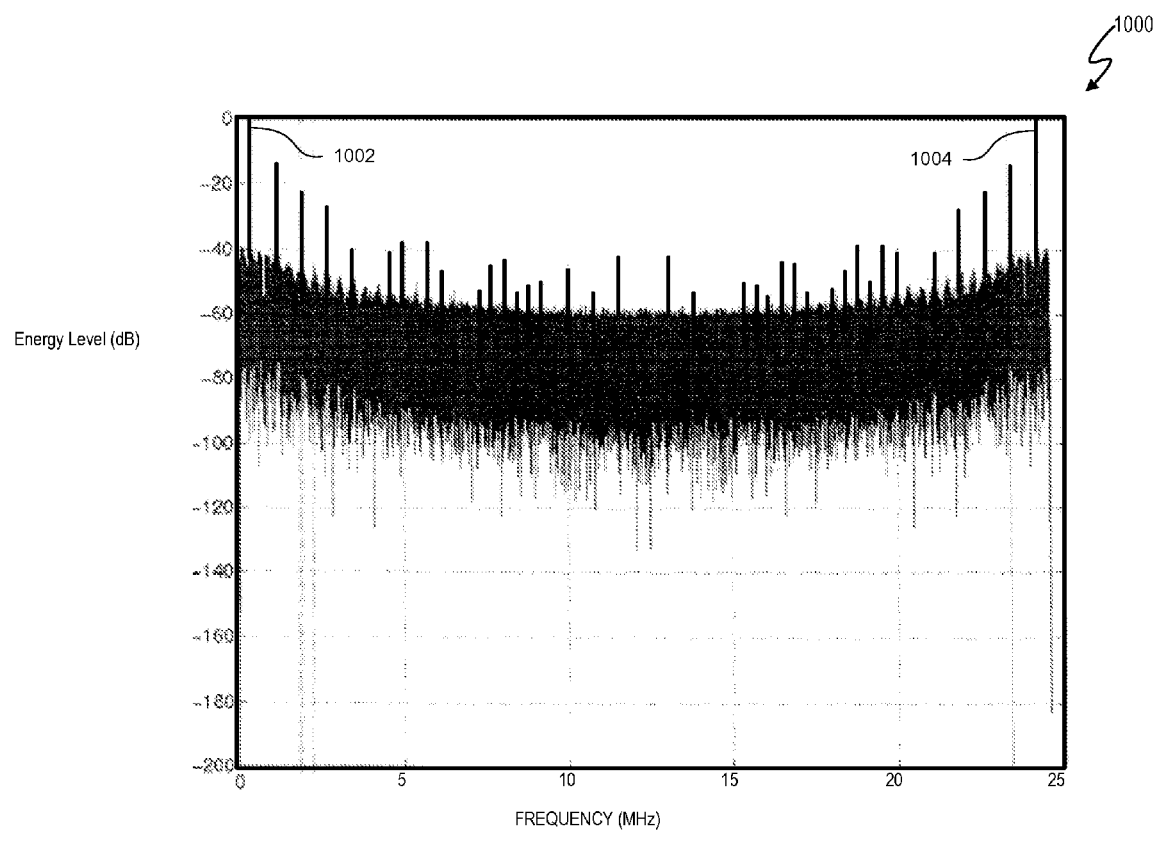
FIG. 10 depicts a frequency analysis of harmonic frequencies of 384 MHz repetitive square waves between 0 and 25 MHz.

FIG. 10 depicts an expanded frequency analysis 1000 of frequencies between 0 and 25 MHz and energy levels between 0 and −200 dB with significantly less energy at the second harmonic frequency 1002 at 768 kHz through the sixty second harmonic frequency 1004 at approximately 23.8 MHz. Thus, in at least one embodiment, the signal processing system 500 can significantly reduce EMI in the RF spectrum.

Figure 11:
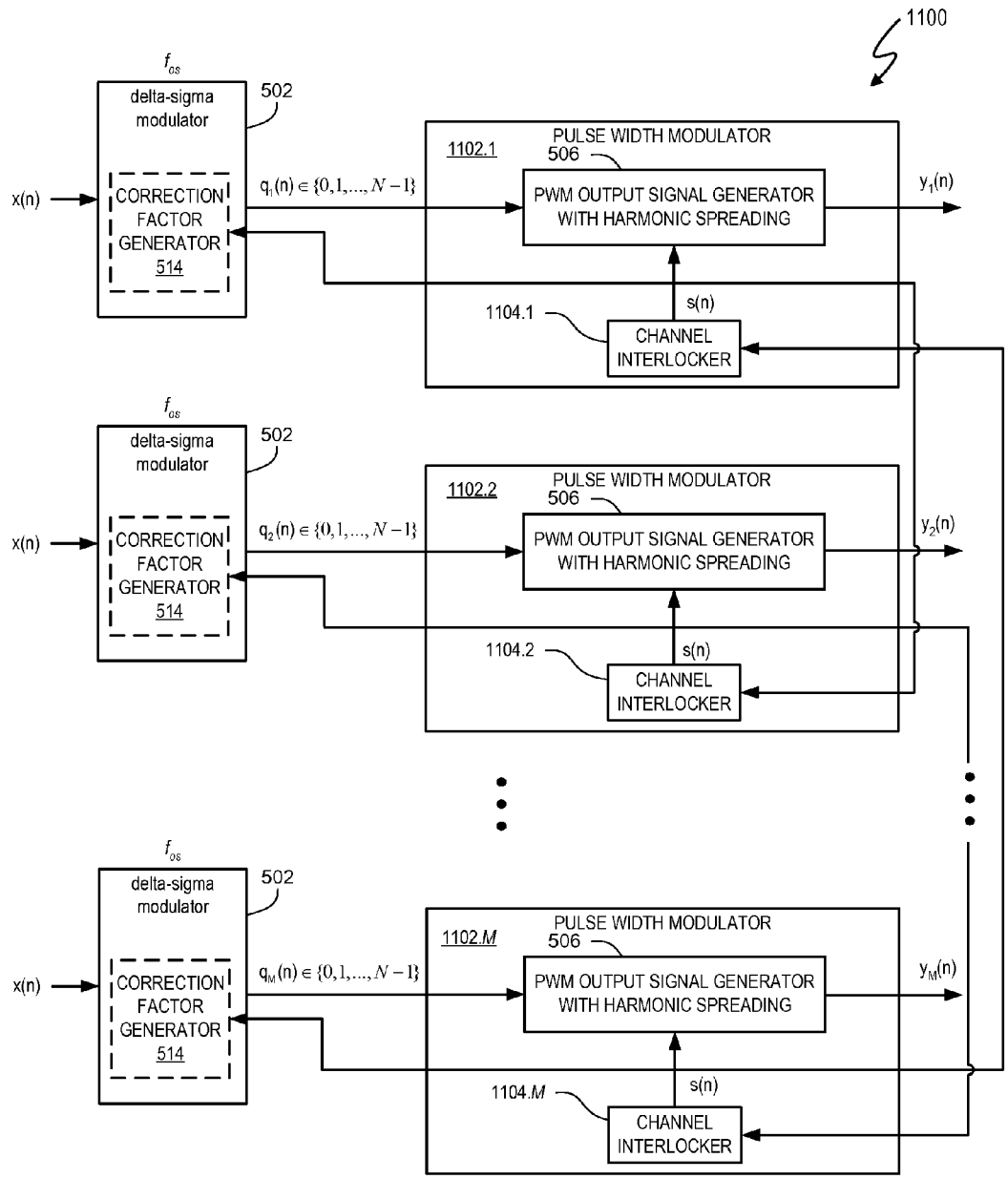
FIG. 11 depicts an M channel signal processing system that utilizes an interlocking procedure to select PWM patterns.

FIG. 11 depicts an M channel signal processing system 1100 that utilizes an interlocking procedure to select PWM patterns that spread the spectrum of intra-channel and inter-channel harmonic frequencies using an interlocking process. In a multi-channel signal processing system, the signal processing system generates M pulse width modulator output signals $y_1(n)$, $y_2(n)$, ..., $y_M(n)$, where M represents the number channels. Each pulse width modulator 1102.1, 1102.2, ..., 1102.M includes a respective channel interlocker 1104.1, 1104.2, ..., 1104.M. PWM patterns are selected sequentially for each channel by respective channel interlockers 1104.1, 1104.2, ..., 1104.M. Thus, in at least one embodiment, PWM pattern selection for a channel by a channel interlocker is responsive to the immediately preceding PWM pattern selection by another channel interlocker. For example, channel interlocker 1104.1 selects a PWM pattern, then channel interlocker 1104.2 selects a PWM pattern, and so on until channel interlocker 1104.M selects a PWM pattern. Once each channel interlocker has selected a PWM pattern, the selection of PWM patterns repeats. The channel interlockers 1104.1, 1104.2, ..., 1104.M are sequentially coupled together so that selection of a PWM pattern by channel interlocker 1104.i is responsive to the preceding PWM pattern selection by channel interlocker 1104.i−1, i∈{1, 2, ..., M}. The interlocking process repeats so the PWM pattern selection by channel interlocker 1104.1 is responsive to the PWM pattern selection of channel interlocker 1104.M after the first round of PWM pattern selections.

Each channel interlocker selects the PWM pattern to be generated and inserted into a frame of PWM output signal y(n) to determine the amount to shift each rising pulse edge based upon the rising pulse edge shift in a corresponding frame of the immediately preceding channel.

Figure 12:
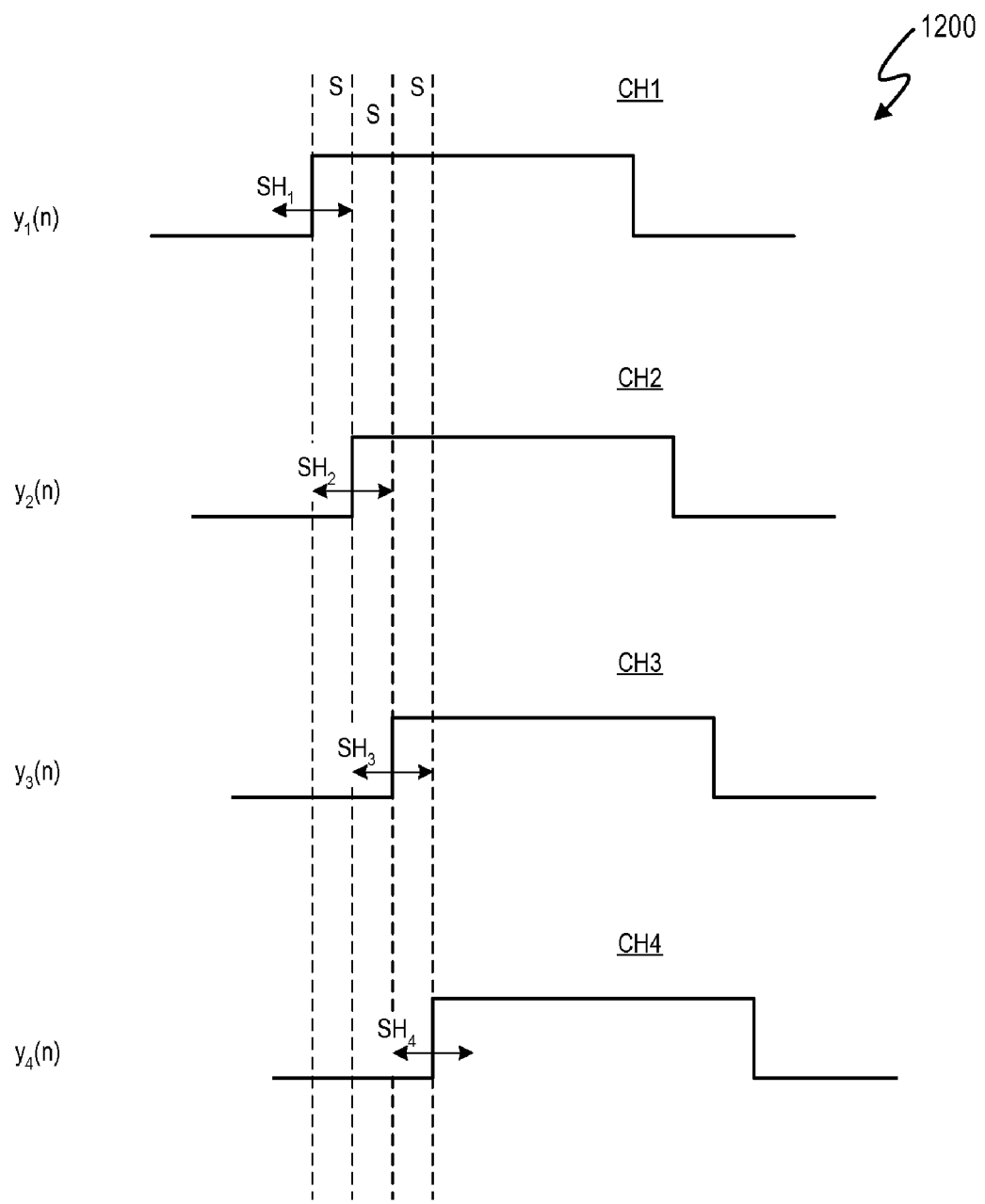
FIG. 12 depicts an exemplary time-domain, multi-frame representation of multi-channel output signals.

Referring to FIGS. 11 and 12, FIG. 12 depicts an exemplary time-domain, multi-frame representation of multi-channel output signals $y_1(n)$, $y_2(n)$, $y_3(n)$, and $y_4(n)$ (M=4). Pulses of channels CH1, CH2, CH3, and CH4 have a large number of available shifting options (delaying and advancing) to prevent non-overlap of rising and falling edges.

In the interlocking procedure undertaken by the channel interlockers 1104.1, 1104.2, ..., 1104.M, the pulse rising edge of each PWM pattern has a nominal spacing in time of +/−S between pulse rising edges of PWM patterns of adjacent channels. PWM patterns associated with a single quantization level have pulse rising edges that shift in time from frame-to-frame by a factor of SH. In at least one embodiment, SH is greater than one time slot of a PWM output signal y(n) frame. Selection of the PWM patterns for each channel to achieve intra-channel and inter-channel spreading of the spectrum of harmonic frequencies is a function of the spacing S and the shift SH. In at least one embodiment, the shift options are from $-SH_i$ to $+SH_i$, and $-SH_i = SH_p - (S-1)$ and $+SH_i = S$, where "$-SH_i$" refers to an advance of the pulse rising edge, i.e. a shift to the left in time, and "+SH" refers to a delay of the pulse rising edge, i.e. a shift to the right in time. "i" refers to the particular channel and "p" refers to the previous channel.

Table 6 represents example determination of selected shift data for each of channels CH1, CH2, CH3, and CH4. The nominal spacing between each channel is a delay S=+8. The channel interlockers 1104.1, 1104.2, ..., 1104.M select a PWM pattern having a shift in the rising edge of the PWM patterns associated with the respective quantization levels of quantizer output signal $q_1(n)$, $q_2(n)$, $q_3(n)$, and $q_4(n)$ that falls within the range of $-SH_i$ and $+SH_i$ from Table 6. The selected PWM pattern is indicated in the value of PWM pattern selection signal s(n). The Selected Shift Data represents the shift of the selected PWM pattern rising edge in relation to the rising edge of the selected PWM pattern of the previous channel. The Selected Shift Data in Table 6 also represents $SH_p$ for the next channel to be processed.

TABLE 6

| Channel | $-SH_i$ | $+SH_i$ | Selected Shift Data |
|---|---|---|---|
| 1 | −7 | +8 | 0 |
| 2 | −7 | +8 | +3 |
| 3 | −4 | +8 | +4 |
| 4 | −3 | +8 | −1 |
| 1 | −8 | +8 | −2 |
| 2 | −9 | +8 | +5 |
| 3 | −2 | +8 | +1 |
| 4 | −6 | +8 | −4 |

In other embodiments of signal processing system 110, the falling edges of pulses in each channel can be shifted to obtain reduced intra-channel and inter-channel decorrelation be reversing the interlocking procedure. Additionally, other procedures can be used to obtain reduced intra-channel and inter-channel correlation.

Although the present invention has been described in detail, it should be understood that various changes, substitutions and alterations can be made hereto without departing from the spirit and scope of the invention as defined by the appended claims. For example, additional PWM pattern tables could be included in memory 508. Additionally, each PWM pattern could be split into multiple pulses for a single period T.

What is claimed is:

1. A method of spreading a spectrum of harmonic frequencies in a PWM output signal, the method comprising:
   receiving an input signal representing one of N quantization levels of a delta sigma modulator, wherein N is an integer greater than or equal to two (2);
   selecting a first pulse width modulator (PWM) pattern associated with the quantization level from a group of K PWM patterns, wherein:
   K is an integer greater than or equal to two (2); and
   the PWM patterns have discrete time slots during which a pulse can rise and fall;
   selecting a second PWM pattern associated with the quantization level from the group of K patterns, wherein selection of the second PWM pattern causes a rising edge of the second PWM pattern to shift in time at least two discrete time slots relative to a rising edge of the first PWM pattern to spread the spectrum of harmonic frequencies in the PWM output signal;
   generating a frame of the PWM output signal with the selected PWM pattern; and
   providing the PWM output signal to an amplifier.

2. The method of claim 1 wherein the delta sigma modulator includes a loop filter coupled to a quantizer and the loop filter includes multiple integrators, the method further comprising:
   generating respective correction factors for at least one of the integrators to correct for non-linearities in the PWM output signal caused by the selected PWM pattern, wherein the correction factors are based on the particular PWM pattern selection.

3. The method of claim 1 wherein selecting a pulse width modulator (PWM) pattern associated with the quantization level further comprises:
   randomly selecting one of the K PWM patterns.

4. The method of claim 1 wherein the quantization level, associated with K PWM patterns, corresponds to a frame of the PWM output signal having an approximately 50% duty cycle.

5. The method of claim 1 wherein the K PWM patterns have different harmonic spectra and phases.

6. The method of claim 1 wherein the K PWM patterns within the group of PWM patterns have identical pulse widths and different pulse edge delays.

7. The method of claim 1 further comprising:
   providing the PWM output signal to an amplifier to drive a plurality of switches.

8. The method of claim 1 wherein a plurality of the quantization levels are associated with a respective group of multiple different PWM patterns, and each PWM pattern in each group differs in each group has discrete time slots during which a pulse rises and falls, and (iv) rising edges of PWM patterns in the same group differ from each other by at least two of the discrete time slots to spread the spectrum of harmonic frequencies in the PWM output signal.

9. The method of claim 1 wherein the received input signal is for a first channel, the method further comprising:
   receiving M−1 additional input signals for M−1 additional channels, each input signal represents one of N quantization levels of respective delta sigma modulators, and M is an integer greater than or equal to two (2); and
   for each of the M−1 additional input signals, selecting a PWM pattern associated with the quantization level, wherein the selection is responsive to a preceding selection of a PWM pattern for another channel.

10. The method of claim 9 wherein selecting a PWM pattern associated with the quantization level further comprises:
    determining a range of pulse edge shifts that will prevent overlap of pulse edges between a PWM pattern of the $i^{th}$ channel and the selected PWM pattern of the $(i-1)^{th}$ channel, wherein i∈{0, 1, . . . , M};
    selecting a first PWM pattern for the $i^{th}$ channel having a pulse edge shift within the determined range of pulse edge shifts relative to the selected pattern of the of the $i^{th}$ channel and the selected PWM pattern of the $(i-1)^{th}$ channel; and
    selecting a second PWM pattern for the $i^{th}$ channel having a pulse edge shift within the determined range of pulse edge shifts relative to the selected pattern of the of the $i^{th}$ channel and the selected PWM pattern of the $(i-1)^{th}$ channel.

11. The method of claim 9 wherein for each of the M−1 additional input signals, selecting a PWM pattern further comprises:
    selecting the first and second PWM patterns associated with the quantization level from a group of K PWM patterns, wherein:
    K is an integer greater than or equal to two (2);
    the PWM patterns have discrete time slots during which a pulse can rise and fall; and
    selection of the second PWM pattern causes a rising edge of the second PWM pattern to shift in time at least two discrete time slots relative to a rising edge of the first PWM pattern to spread the spectrum of harmonic frequencies in the PWM output signal.

12. The method of claim 1 wherein the input signal represents a sample of an audio signal.

13. The method of claim 1 wherein selecting the PWM pattern further comprises:
    selecting the PWM pattern from a memory.

14. A signal processing system to spread a spectrum of harmonic frequencies in a PWM output signal, the system comprising:
    a delta sigma modulator to generate a delta sigma modulator output signal sample representing one of N quantization levels, wherein N is an integer greater than or equal to two (2);
    a pulse width modulator (PWM), coupled to the delta sigma modulator, to:
    select a pulse width modulator (PWM) pattern associated with the quantization level from a group of K PWM patterns, wherein:
    K is an integer greater than or equal to two (2);
    the PWM patterns have discrete time slots during which a pulse can rise and fall; and
    rising edges of the PWM patterns in the group of K PWM patterns differ from each other by at least two of the discrete time slots to spread the spectrum of harmonic frequencies in the PWM output signal; and
    generate a frame of the PWM output signal with the selected PWM pattern; and
    an amplifier having an input coupled to the PWM to receive the PWM output signal.

15. The signal processing system of claim 14 wherein the delta sigma modulator includes a loop filter coupled to a quantizer and the loop filter includes multiple integrators, the system further comprising:
    a correction factor generator to generate respective correction factors for at least one of the integrators to correct for non-linearities in the PWM output signal caused by the selected PWM pattern, wherein the correction factors are based on the particular PWM pattern selection.

16. The signal processing system of claim 14 wherein the PWM output signal generator is further configured to randomly select one of the K PWM patterns.

17. The signal processing system of claim 14 wherein the quantization level, associated with K PWM patterns, corresponds to a frame of the PWM output signal having an approximately 50% duty cycle.

18. The signal processing system of claim 14 wherein the K PWM patterns have different harmonic spectra and phases.

19. The signal processing system of claim 14 wherein the K PWM patterns within the group of PWM patterns have identical pulse widths and different pulse edge delays.

20. The signal processing system of claim 14 further comprising an amplifier coupled to the pulse width modulator to receive the generated PWM output signal.

21. The signal processing system of claim 14 wherein a plurality of the quantization levels are associated with a respective group of multiple different PWM patterns, and each PWM pattern in each group differs in each group has discrete time slots during which a pulse rises and falls, and rising edges of PWM patterns in the same group differ from each other by at least two of the discrete time slots to spread the spectrum of harmonic frequencies in the PWM output signal.

22. The signal processing system of claim 14 wherein the PWM is further configured to repeat receiving the input signal, selecting the PWM pattern, generating the frame of the PWM output signal, and providing the PWM output signal for multiple quantization levels wherein (i) a plurality of the quantization levels are associated with respective groups of multiple PWM patterns, (ii) a number of PWM patterns in each of the groups can be different, (iii) the PWM patterns in each group of PWM patterns have discrete time slots during which a pulse rises and falls, and (iv) rising edges of PWM patterns in the same group differ from each other by at least two of the discrete time slots to spread the spectrum of harmonic frequencies in the PWM output signal.

23. The signal processing system of claim 14 wherein the input signal represents a sample of an audio signal.

24. The signal processing system of claim 14 further the pulse width modulator further comprises a memory to store the PWM patterns.

25. The signal processing system of claim 14 wherein the delta sigma modulator is for a first channel, the system further comprising:
M−1 additional delta sigma modulators to generated respective output signal samples for M−1 additional channels, wherein each input signal represents one of N quantization levels of respective delta sigma modulators, and M is an integer greater than or equal to two (2); and
M−1 additional pulse width modulators each coupled to a respective delta sigma modulator, to respectively select a PWM pattern associated with the quantization level, wherein the selection is responsive to a preceding selection of a PWM pattern for another channel.

26. The signal processing system of claim 25 wherein each of the pulse width modulators is further configured to (i) determine a range of pulse edge shifts that will prevent overlap of pulse edges between a PWM pattern of the $i^{th}$ channel and the selected PWM pattern of the $(i-1)^{th}$ channel, wherein $i \epsilon \{0, 1, \ldots, M\}$ and (ii) select a PWM pattern for the $i^{th}$ channel having a pulse edge shift within the determined range of pulse edge shifts relative to the selected pattern of the of the $i^{th}$ channel and the selected PWM pattern of the $(i-1)^{th}$ channel.

27. The signal processing system of claim 25 wherein for each of the M−1 additional input signals, each of the pulse width modulators is further configured to select a pulse width modulator (PWM) pattern associated with the quantization level from a group of K PWM patterns, wherein (i) K is an integer greater than or equal to two (2), (ii) the PWM patterns have discrete time slots during which a pulse can rise and fall, and (iii) rising edges of the PWM patterns in the group of K patterns differ from each other by at least two of the discrete time slots to spread the spectrum of harmonic frequencies in the PWM output signal.

28. An apparatus for spreading a spectrum of harmonic frequencies in a PWM output signal, the apparatus comprising:
means for receiving an input signal representing one of N quantization levels of a delta sigma modulator, wherein N is an integer greater than or equal to two (2);
means for selecting a first pulse width modulator (PWM) pattern associated with the quantization level from a group of K PWM patterns, wherein:
K is an integer greater than or equal to two (2); and
the PWM patterns have discrete time slots during which a pulse can rise and fall;
means for selecting a second PWM pattern associated with the quantization level from the group of K patterns, wherein selection of the second PWM pattern causes a rising edge of the second PWM pattern to shift in time at least two discrete time slots relative to a rising edge of the first PWM pattern to spread the spectrum of harmonic frequencies in the PWM output signal;
means for generating a frame of the PWM output signal with the selected PWM pattern; and
means for amplifying the PWM output signal.

29. A method of spreading a spectrum of harmonic frequencies in a PWM output signal, the method comprising:
receiving an input signal representing one of N quantization levels, wherein N is an integer greater than or equal to two (2);
selecting a first pulse width modulator (PWM) pattern associated with the quantization level from a group of K PWM patterns, wherein:
K is an integer greater than or equal to two (2); and
the PWM patterns have discrete time slots during which a pulse can rise and fall;
selecting a second PWM pattern associated with the quantization level from the group of K patterns, wherein selection of the second PWM pattern causes a rising edge of the second PWM pattern to shift in time at least two discrete time slots relative to a rising edge of the first PWM pattern to spread the spectrum of harmonic frequencies in the PWM output signal; and
generating a frame of the PWM output signal with the selected PWM pattern.

* * * * *